United States Patent
De Vries (10) Patent No.: US 8,815,749 B2
(45) Date of Patent: Aug. 26, 2014

(54) METHOD FOR MANUFACTURING A BARRIER LAYER ON A SUBSTRATE AND A MULTI-LAYER STACK

(75) Inventor: Hindrik De Vries, Tilburg (NL)

(73) Assignee: Fujifilm Manufacturing Europe B.V. (NL)

( * ) Notice: Subject to any disclaimer, the term of this patent is extended or adjusted under 35 U.S.C. 154(b) by 0 days.

(21) Appl. No.: 13/811,326

(22) PCT Filed: Jul. 12, 2011

(86) PCT No.: PCT/GB2011/051305
§ 371 (c)(1),
(2), (4) Date: Jan. 21, 2013

(87) PCT Pub. No.: WO2012/010866
PCT Pub. Date: Jan. 26, 2012

(65) Prior Publication Data
US 2013/0178060 A1   Jul. 11, 2013

(30) Foreign Application Priority Data
Jul. 21, 2010  (GB) .................................. 1012225.7

(51) Int. Cl.
*H01L 21/31* (2006.01)
(52) U.S. Cl.
USPC ........................................................ 438/761
(58) Field of Classification Search
USPC .......................... 438/761, 763, 778, 788, 792
See application file for complete search history.

(56) References Cited

U.S. PATENT DOCUMENTS

| | | | |
|---|---|---|---|
| 6,413,645 B1 | 7/2002 | Graff et al. | |
| 6,774,569 B2 | 8/2004 | de Vries et al. | |
| 7,166,335 B2 | 1/2007 | Fukuda et al. | |
| 7,298,072 B2 | 11/2007 | Czeremuszkin et al. | |
| 7,399,944 B2 | 7/2008 | DeVries et al. | |
| 7,651,741 B2 | 1/2010 | Yamada et al. | |
| 8,323,753 B2 | 12/2012 | De Vries et al. | |
| 2005/0019503 A1 | 1/2005 | Komada | |
| 2006/0166023 A1 | 7/2006 | Yoshikata et al. | |
| 2008/0220184 A1* | 9/2008 | Sakurai et al. ............... | 428/1.51 |
| 2008/0317974 A1 | 12/2008 | de Vries et al. | |
| 2010/0255625 A1 | 10/2010 | De Vries | |
| 2011/0014424 A1 | 1/2011 | De Vries | |
| 2011/0049491 A1 | 3/2011 | De Vries et al. | |

FOREIGN PATENT DOCUMENTS

| | | | | |
|---|---|---|---|---|
| EP | 2226832 A1 | 8/2010 | | |
| JP | 2003171770 A | 6/2003 | | |
| JP | 2006168340 A | 6/2006 | | |
| WO | 99/04411 A1 | 1/1999 | | |
| WO | 2007/089146 A1 | 8/2007 | | |
| WO | 2008/147184 A2 | 12/2008 | | |
| WO | WO2009/099325 A1 * | 8/2009 | ............... | H05H 1/24 |
| WO | WO2009/104957 A1 * | 8/2009 | ............... | H01J 37/32 |

\* cited by examiner

*Primary Examiner* — Mohsen Ahmadi
*Assistant Examiner* — Reema Patel
(74) *Attorney, Agent, or Firm* — Banner & Witcoff, Ltd.

(57) ABSTRACT

A method for manufacturing a barrier layer (14) on a flexible substrate (6a, 6b), comprising depositing an inorganic layer on the substrate in a treatment space (5), the treatment space (5) being formed between at least two electrodes (2, 3) for generating an atmospheric pressure glow discharge plasma. The barrier layer (14) is characterized in that it is formed by three subsequent depositions of inorganic layers on the substrate (6a, 6b), each layer being at most 150 nm in thickness.

19 Claims, 4 Drawing Sheets

METHOD FOR MANUFACTURING A BARRIER LAYER ON A SUBSTRATE AND A MULTI-LAYER STACK

RELATED APPLICATION DATA

This application is a National Stage Application under 35 U.S.C. 371 of co-pending PCT application PCT/GB2011/051305 designating the United States and filed Jul. 12, 2011; which claims the benefit of GB patent application number 1012225.7 and filed Jul. 21, 2010 each of which are hereby incorporated by reference in their entireties.

TECHNICAL FIELD

The present invention relates to a method for manufacturing a barrier layer on a flexible substrate. In further aspects, a method is provided for manufacturing a multi-layer stack structure, the structure comprising in order a substrate-a barrier layer-an adhesive layer-a barrier layer-a substrate.

BACKGROUND ART

Photovoltaic ("PV") modules are large-area optoelectronic devices that convert solar radiation directly into electrical energy. PV modules are made by interconnecting individually formed and separate solar cells, e.g., multi-crystalline or mono-crystalline silicon solar cells, and then mechanically supporting and protecting the solar cells against environmental degradation by integrating the cells into a laminated PV module. The laminated modules generally comprise a rigid and transparent protective front panel or sheet, and a rear panel or sheet which is typically called a back-sheet. Forming a sandwiched arrangement between the front panel and back-sheet are the interconnected solar cells and an encapsulant which is transparent to solar radiation. The front panel and back-sheet encapsulate the solar cell(s) and provide protection from environmental damage. The primary function of the back sheet is to provide the low water vapor transmission, UV and oxygen barrier properties and necessary to protect the silicon wafers (photocells) from degradation induced by reaction with water, oxygen or UV radiation. Because the silicon wafers are generally encapsulated in ethylene vinyl acetate (EVA) the back-sheet material should adhere well to EVA when the components are laminated together in a thermo-forming process.

US2006/0166023 describes back-side protective sheets for PV battery module comprising a vapor-deposited film of an inorganic oxide in a vacuum chamber. The thickness of the vapor-deposited film of an inorganic oxide is described to be lower than 400 nm because of cracking of the film.

WO2009/099325 from applicant which is hereby incorporated by reference describes the manufacturing of a multi-layer stack especially for OLED devices with improved water vapour transmission ratio (WVTR) properties.

Documents WO 2008/147 184 and EP 2 226 832 A, both from applicant, disclose an atmospheric pressure plasma treatment apparatus and method.

JP 2003-171 770 A discloses an apparatus for creating an anti-reflective layer on a substrate, the apparatus comprising a plurality of discharge sections. However, JP 2003-171 770 does not disclose the conditions for creating an improved barrier layer.

WO 2009/031886 A by applicant also discloses an apparatus for plasma treatment having multiple treatment spaces. Again, the conditions for creating an improved barrier layer are not disclosed.

DISCLOSURE OF THE INVENTION

In the art of manufacturing and commercialization of flexible thin substrate material i.e. back sheets or front-sheets for PV cells or PV modules displaying good properties as barrier properties, good handling properties and being defect-free a more cost-effective and a simpler process is desired.

In a first aspect of the present invention, a method is provided for manufacturing a barrier layer, in particular a water vapour barrier layer, on a flexible substrate, comprising depositing an inorganic layer on the substrate in a treatment space, the treatment space being formed between at least two electrodes for generating an atmospheric pressure glow discharge plasma. The barrier layer is characterized in that it is formed by deposition of at least three inorganic layers after each other on the substrate, each of the deposited inorganic layers being at most 150 nm in thickness. All of the at least three subsequent inorganic layer depositions can take place in the same treatment space, or in two or more separate treatment spaces. For example, one treatment space per inorganic layer deposition may be provided. Each of the at least three inorganic layers can be formed of essentially the same material (for example, by using essentially the same precursor gas compositions in each of the treatment spaces). However, each of the at least three inorganic layers can be formed using two, three or more different materials (for example, by using various the precursor gas compositions in the different treatment spaces).

The present invention provides an effective, efficient and cheap process for manufacturing of a flexible multi-layer material with excellent web-handling property. Further the invention provides an excellent multilayer stack especially in use as back sheet or front sheet for PV-cells or PV-modules.

In a further embodiment, each layer deposited is thicker than 50 nm, e.g. thicker than 60 or 100 nm. This allows to efficiently reach a total thickness of the barrier layer which is sufficient to reach predetermined characteristics, such as WVTR.

In a specific embodiment the at least three subsequent layer depositions are being executed in separate treatment spaces. Operating conditions in each treatment space can then be optimized. In a further embodiment, two of the at least three subsequent layer depositions are being executed in the same treatment space. This provides for a very efficient total treatment, and may especially be used when treating a substrate in the form of a continuous web or film.

In a further embodiment, a gas atmosphere is provided in each treatment space, wherein the gas atmosphere comprises between 4 and 25% of oxygen, e.g. between 6 and 21% of oxygen. Using the present invention embodiments allows to provide for deposition rates of more than 50 nm/s, e.g. 200 nm/s, as a result of which a very efficient and cost effective manufacturing process can be obtained.

In an even further embodiment, the method further comprises manufacturing a multi-layer stack structure, the structure comprising in order a substrate-a barrier layer-an adhesive layer-a barrier layer-a substrate, by laminating two substrates with a barrier layer with an adhesive layer in between the facing surfaces of the barrier layers to obtain the multi-layer stack structure. By treating two substrates through at least three treatment spaces and subsequently laminating of the two substrates, a very efficient production process is obtained resulting in a multi-layer stack structure having good barrier properties. Also, a more uniform treatment of the substrates is achieved when using said three treatment spaces by two substrates simultaneously.

In a further embodiment, the method further comprises laminating two or more multi-layer stack structures with an additional adhesive layer in between. By further stacking multi-layer stack structures, the WVTR characteristics may be even further improved.

In a further embodiment, the two substrates are provided on a roll to obtain the multi-layer stack structure in a continuous process. E.g. the substrates are provided as sheets to obtain the multi-layer stack structure in a continuous process. For example, the substrates may be provided from two rolls with a predetermined width, and the laminated structure may be spooled on a receiving roll. This two roll-to-one roll process is very efficient for continuous manufacturing of the multi-layer stack structure, by adhering the two treated substrates with the treated surfaces facing each other by lamination into one roll using an adhesive.

In a further embodiment, the method comprising treating the two substrates through at least three treatment spaces simultaneously. This will result in even more uniform and efficient process of manufacturing. In an even further embodiment, the two substrates are treated in the same treatment spaces.

In a further aspect this invention relates to a protective back- or front sheet for a PV- (or solar) cell or module comprising such a multi-layer stack structure being flexible and moisture resistant and a PV battery module using the same. E.g. a roll of treated substrate for use in a roll-to-roll application prepared by the method according to any one of the present invention embodiments is provided, or a roll of a multi-layered structure for a PV back or front sheet application comprising a multi-layer stack structure. Furthermore, a device comprising a part of such a roll is provided, such as a PV-cell or PV-module, in which the treated substrate or multi-layer stack structure is used as a flexible protective back or front sheet.

In a further embodiment, the substrates are organic resin films. Examples of such organic resin films (of polymer materials) include, but are not limited to PEN (PolyEthylene Naphtalate), PET (PolyEthylene Teraphtalate), PC (PolyCarbonate), COP (Cyclic Olefin Polymer), COC (Cyclic Olefin CoPolymer), etc. Other embodiments use ethylene-vinyl acetate copolymer (EVA) or polyvinyl butyral (PVB) as substrates. The thickness of the substrates may be between 20 and 800 μm, e.g. 50 μm or 200 μm.

In a further embodiment, the step of treating the facing surfaces is executed with a duty cycle of at least 90% and another embodiment is having a duty cycle of 100%. This effectively reduces the formation of dust when depositing the inorganic layer on the substrates.

An atmospheric pressure glow discharge is generated in a further embodiment by applying electrical power from one or more (dynamic matched) power supplies connected to the two electrodes (or electrode couple) in said at least three treatment spaces.

SHORT DESCRIPTION OF THE FIGURES

The present invention will be discussed in more detail below, using a number of exemplary embodiments, with reference to the attached drawings, in which.

DETAILED DESCRIPTION OF THE INVENTION

Figure 1:
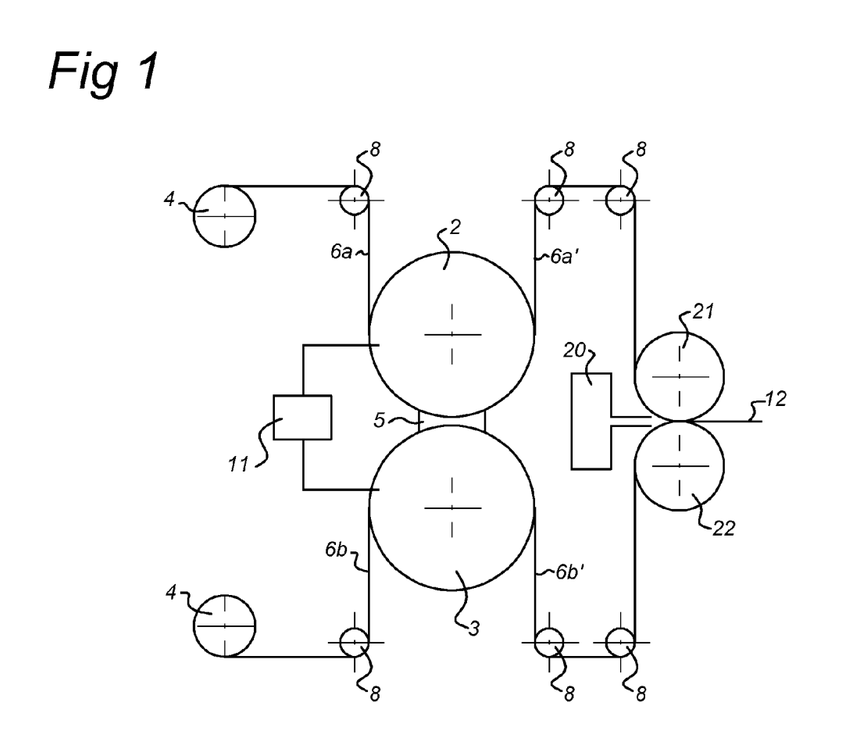
FIG. 1 shows a schematic view of a plasma generation apparatus in which the present invention may be embodied.

FIG. 1 shows a schematic view of a simplified exemplary plasma apparatus 10 in which the present invention embodiments may be applied. The plasma apparatus 10 according to the present invention embodiments comprises at least three treatment spaces 5, 5', 5", in FIG. 1 shown as a single treatment space 5 for reasons of simplicity.

Each treatment space 5 may be a treatment chamber within an enclosure 7 (not shown in FIG. 1) or a treatment spaces 5 with an open structure (as shown in FIG. 1). Two curved electrodes 2,3 are provided, e.g. cylinder shaped electrodes 2, 3. In general the electrode couples or electrodes 2,3 are provided with a dielectric barrier in order to be able to generate and sustain a glow discharge at atmospheric pressure in the treatment space 5.

Two substrates 6a, 6b are fed from two source rolls 4 through the treatment space 5 (e.g. for depositing a layer on the surface of the substrates 6a, 6b, or to treat the surface of the substrates 6a, 6b for subsequent processing). Guiding or tensioning rollers 8 are provided to assure the substrates 6a, 6b are kept tightly on the surface of the electrodes 2, 3. In the system shown in FIG. 1, the resulting treated substrates 6a', 6b' are subsequently bonded together in a laminating system 23, the laminating system 23 in this example comprising e.g. a glue dispenser 20 and two pressure rollers 21, 22. As a result, a laminated multi-layer stack structure 12 is provided. As an alternative, the treated substrates 6a', 6b' are stored (e.g. on a roll) as semi-product for further use on other processes.

Figure 2A:
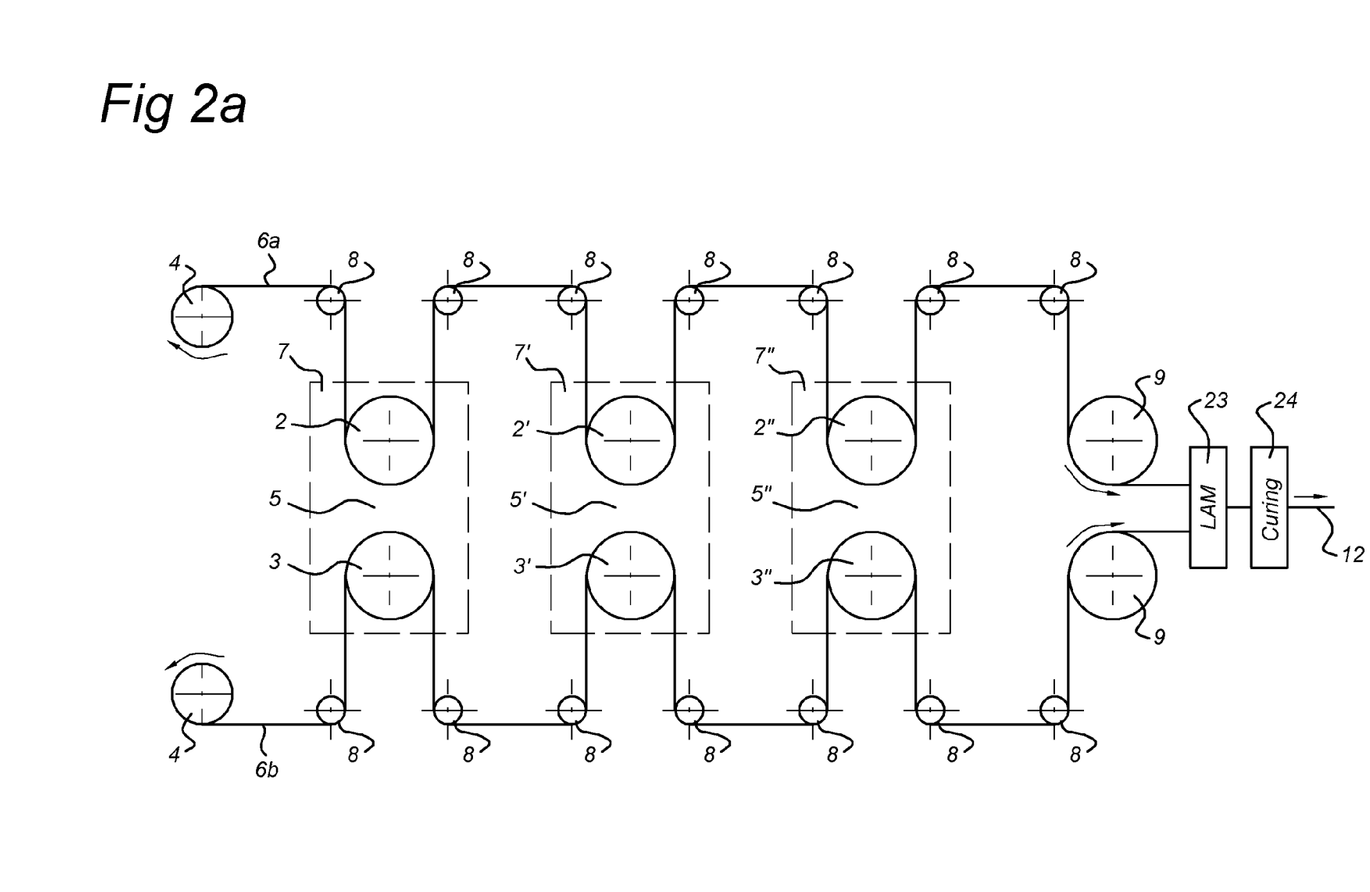
FIGS. 2a and b show schematic views of embodiments involving a 2-rolls-to-1-roll process.

In FIG. 2a, a schematic view is shown of a plasma apparatus 10 in which embodiments of the present invention can be performed. In this case, the plasma apparatus is provided with three separate treatment spaces 5, 5', 5" in three distinct enclosures 7, 7', 7". Each treatment space 5, 5', 5" is provided by electrode pairs 2,3; 2', 3'; 2", 3" all in a manner similar to the one described with reference to FIG. 1. At specific locations, guiding rollers 8 are provided to properly guide the substrates 6a, 6b through the plasma apparatus 10. Tensioning rollers 9 are provided to guide the treated substrates 6a', 6b' to a laminating apparatus 23 (and subsequently through an optional curing element 24) in order to provide the multi-layer stack structure 12.

Figure 2B:
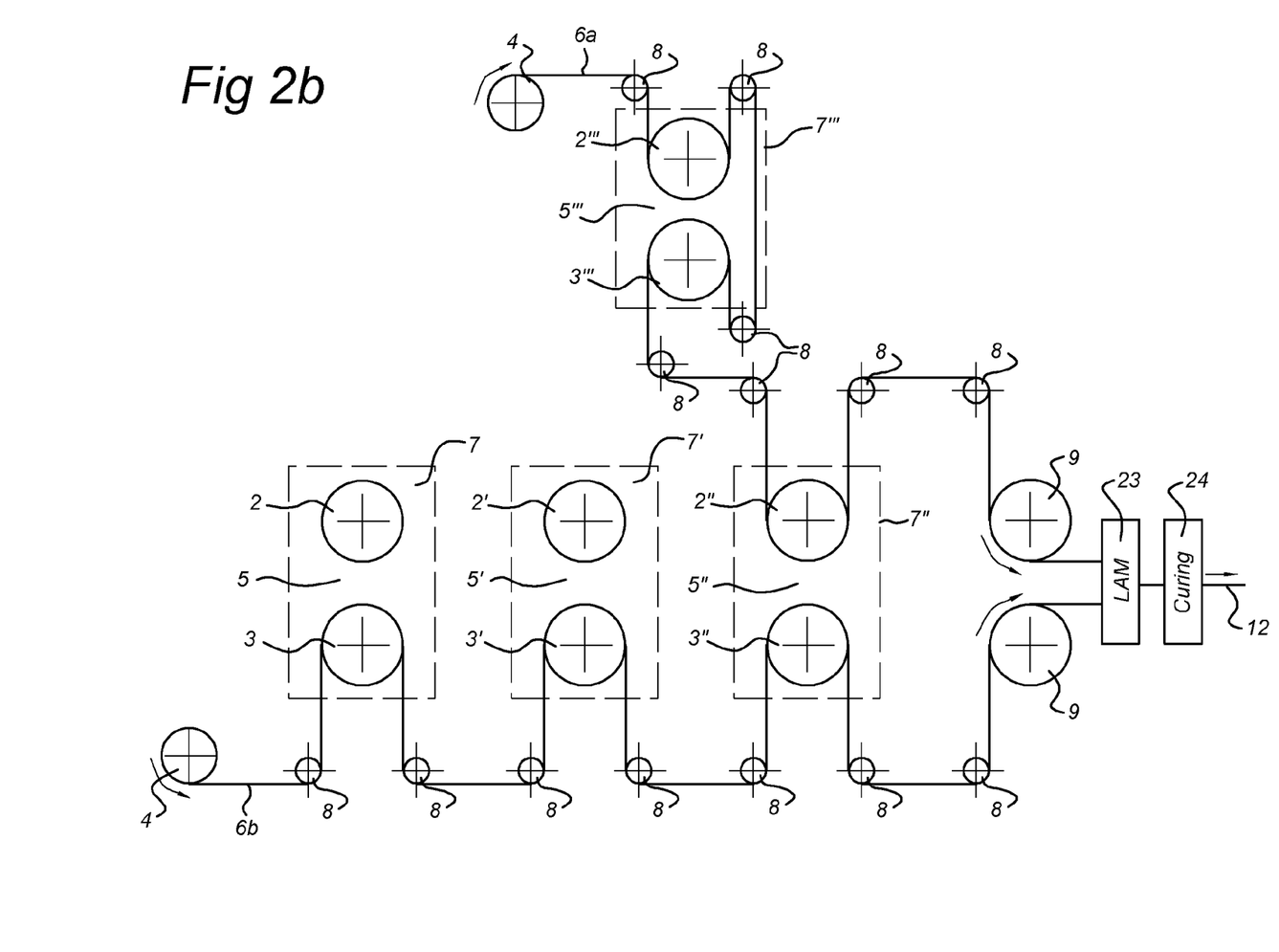

In the example of FIG. 2a two substrates 6a, 6b are simultaneously fed through the same treatment spaces 5, 5', 5" however this is not necessary. FIG. 2b shows an alternative set-up of the plasma apparatus 10, in which a first substrate 6a is treated twice in a separate treatment space 5''' (having an optional enclosure 7''' and electrode pairs 2''', 3'''). A second substrate 6b is treated consecutively in three treatment spaces 5, 5', 5" similar to the embodiment of FIG. 2a. A third treatment of the first substrate 6a is executed simultaneously with the third treatment of the second substrate 6b in treatment space 5".

A characterizing feature of the present invention embodiments is that each of the two substrates 6a, 6b are fed through at least three (same or different) treatment spaces 5 consecutively. In each treatment space 5,5',5" etc, an inorganic layer is deposited with an inorganic barrier amount ranging from 5 nm to at most 150 nm in thickness. In a further exemplary embodiment the range of deposited inorganic layer is from 10 to 100 nm. Depositions of less than 5 nm will not result in barriers having a good water vapour transmission ratio (WVTR) property. Depositions of more than 150 nm are susceptible for defects, e.g. caused by dust.

As a result of the present method embodiments (leading the substrates 6a, 6b through at least three treatment spaces 5) two treated substrates 6a',6b' are provided having both a deposited inorganic layer from which as result from the three or more consecutive depositions the inorganic layer has a thickness commensurate with desired properties such as a minimum WVTR, e.g. a total thickness of the inorganic layer of 450 nm or above.

The electrodes 2,3; 2',3'; 2",3" may be mounted to allow rotation in operation, e.g. using a mounting shaft and/or bearing arrangements. The electrodes 2,3; 2',3'; 2",3" may be provided as a rolling electrode 2,3; 2',3'; 2",3" which is freely rotating or may be driven at certain angular speed using controller and drive units (which as such are known to the skilled person). As a further alternative, the electrodes 2, 3 may be provided using an electrode-couple having a flat/rotary or rotary/flat or even a flat/flat configuration. The electrodes 2, 3 may also be formed from multiple segments.

The substrates 6a, 6b may be provided in the treatment spaces 5 from a respective roll 4, allowing a continuous feed of the substrates 6a, 6b to the treatment space 5 using the guiding rollers 8. Treated substrates 6a', 6b' leave the treatment spaces 5,5',5" etc for further processing (e.g. using the laminating apparatus 23 and curing element 24 to provide the multi-layer stack structure 12) or e.g. as semi-product for storage.

Treating the two substrates 6a, 6b in the at least three same treatment spaces 5, 5', 5" simultaneously provides a much more uniform and effective plasma treatment as compared to the application of using separate treatment processes for each substrate 6a, 6b separately.

The formation of a glow discharge plasma may be stimulated by controlling the displacement current (dynamic matching) using a plasma control unit 11 (see FIG. 1) connected to the electrodes 2, 3; 2',3';2",3" leading to a uniform activation of the surface of substrate 6a, 6b in the treatment space 5. The plasma control unit 11 e.g. comprises a power supply and associated control circuitry as described in the pending international patent application PCT/NL2006/050209, and European patent applications EP-A-1381257, EP-A-1626613 of applicant, which are herein incorporated by reference.

In another embodiment each electrode couple can have its own power control unit 11, 11', 11" to electrode couple 2,3; electrode couple 2',3'; electrode couple 2",3" respectively and each said power unit comprises a power supply and associated control circuitry as described in the pending international patent application PCT/NL2006/050209, and European patent applications EP-A-1381257, EP-A-1626613 of applicant, which are herein incorporated by reference.

The invention further relates to a method of manufacturing a multi-layer stack structure 12 providing a good barrier to water vapour and being defect-free. Furthermore, the invention relates to a defect-free protective (back) sheet (formed by a treated substrate 6a', 6b' or a multi-layer stack structure 12) for PV-cells or PV battery modules having a thick deposited barrier providing excellent barrier properties such as against water vapour.

An atmospheric plasma apparatus 10 could not be used before until now for making thick barrier layers on a flexible substrate 6a, 6b without cracks, i.e. for instance having a barrier layer thickness of 450 nm, 600 nm, 700 nm or 1000 nm thick on a flexible substrate 6a, 6b. Surprisingly using this new method by providing two substrates 6a, 6b simultaneously through at least three treatment spaces 5, 5', 5", it was surprisingly found that it is possible to make defect-free inorganic barrier layers of e.g. 450 nm, 600 nm, 700 nm, 800 nm, 900 nm, 1000 nm on said flexible substrate 6a, 6b without cracking and also having good barrier properties. Such barrier properties were not obtained when the deposition was done via one treatment space (e.g. using an at least three times lower substrate line speed) and having enough strength. After a lamination step of the treated substrates 6a, 6b a multi-layer stack product 12 as a result is obtained which has very good barrier property and which can be perfectly handled in roll-shape.

In order to quantify water vapour transmission rates for barrier films the Mocon Aquatran is used (which uses a coloummetric cell (electrochemical cell) with a minimum detection limit of $5*10^{-4}$ $g/m^2 \cdot day$). This method provides a more sensitive and accurate permeability evaluation than the permeation measurement by using IR absorption (known to the person skilled in the art). Measurement conditions can be varied from 10-40° C. and also relative humidity usually from 60-90%.

In the treatment spaces 5 a combination of gasses may be introduced from one or more gas supply devices (not shown), including a pre-cursor material. The gas supply devices may be provided with storage, supply and mixing components as known to the skilled person. The purpose is to have the pre-cursor decomposed in the treatment spaces 5 to a chemical compound or chemical element which is deposited on the surfaces of the two substrates 6a, 6b. It may be advantageous to have different precursors in each different treatment space 5 however in the case for a sheet as back sheet in PV-application it is preferred to have one precursor resulting in one and the same deposition composition.

In general the combination of gases comprises in the treatment spaces 5 besides the precursor an active gas like for example oxygen and a mixture of inert gases. In one embodiment this combination of gasses comprises oxygen as active gas in a range from 4 to 25%. In another embodiment said combination may use oxygen in a range of 6 to 21%. In another embodiment as gas mixture air is used.

The duty cycle, defined as the power on time divided by the sum of the power on and power of time of these pulsing examples is large, typically in the range of 90% or higher and is even more preferred 100%.

The power supply or supplies for each electrode couple 2, 3 may have a power supply independent from other electrode couple(s) can be a power supply providing a wide range of frequencies. For example it can provide a low frequency (f=10-450 kHz) electrical signal during the on-time. It can also provide a high frequency electrical signal for example f=450 kHz-30 MHz. Also other frequencies can be provided like from 450 kHz-1 MHz or from 1 to 20 MHz and the like.

Good results are obtained in general with a precursor concentration from 2 to 500 ppm of the gas composition and for example an oxygen concentration of e.g. 0.01% of the gas phase, or more, e.g. 2%, but less than 25% for example 10%.

Although oxygen as a reactive gas in this invention has a many advantages also other reactive gases might be used like for example hydrogen, carbon dioxide, ammonia, oxides of nitrogen, and the like. It may be advantageous to a different gas compositions per treatment space.

In the present invention precursors can be can be selected from (but are not limited to): $W(CO)6$, $Ni(CO)4$, $Mo(CO)6$, $Co2(CO)8$, $Rh4(CO)12$, $Re2(CO)10$, $Cr(CO)6$, or $Ru3(CO)12$, Tantalum Ethoxide ($Ta(OC2H5)5$), Tetra Dimethyl amino Titanium (or TDMAT) $SiH4$ $CH4$, $B2H6$ or $BC13$, $WF6$, $TiC14$, $GeH4$, $Ge2H6Si2H6$ $(GeH3)3SiH$, $(GeH3)2SiH2$, hexamethyldisiloxane (HMDSO), tetramethyldisiloxane (TMDSO), 1,1,3,3,5,5-hexamethyltrisiloxane, hexamethyl-cyclotetrasiloxane, octamethylcyclotetrasiloxane, decamethylcyclopentanesiloxane, tetraethoxysilane (TEOS), methyltrimethoxysilane, methyltriethoxysilane, dimethyldimethoxysilane, dimethyldiethoxysilane, trimethylethoxysilane, ethyltrimethoxysilane, ethyltriethoxysilane, n-propyltrimethoxysilane, n-propyltriethoxysilane, n-butyltrimethoxysilane, i-butyltrimethoxysilane, n-hexyltrimethoxysilane, phenyltrimethoxysilane, vinyltrimethoxysilane, vinyltriethoxysilane, aminomethyltrimethylsilane, dimethyldimethylaminosilane, dimethylaminotrimethylsilane, allylaminotrimethylsilane, diethylaminodimethylsilane, 1-trimethylsilylpyrrole, 1-trimethylsilylpyrrolidine, isopropylaminomethyltrimethylsilane, diethylaminotrimethylsilane, anilinotrimethylsilane, 2-piperidinoethyltrimethylsilane, 3-butylaminopropyltrimethylsilane, 3-piperidinopropyltrimethylsilane, bis(dimethylamino)methylsilane, 1-trimethylsilylimidazole, bis(ethylamino)dimethylsilane, bis(butylamino)dimethylsilane, 2-aminoethylaminomethyldimethylphenylsilane, 3-(4-methylpiperazinopropyl)trimethylsilane, dimethylphenylpiperazinomethylsilane, butyldimethyl-3-piperazinopropylsilane, dianilinodimethylsilane, bis(dimethylamino)diphenylsilane, 1,1,3,3-tetramethyldisilazane, 1,3-bis(chloromethyl)-1,1,3,3-tetramethyldisilazane, hexamethyldisilazane, 1,3-divinyl-1,1,3,3-tetramethyldisilazane, dibutyltin diacetate, aluminum isopropoxide, tris(2,4-pentadionato)aluminum, dibutyldiethoxytin, butyltin tris(2,4-pentanedionato), tetraethoxytin, methyltriethoxytin, diethyldiethoxytin, triisopropylethoxytin, ethylethoxytin, methylmethoxytin, isopropylisopropoxytin, tetrabutoxytin, diethoxytin, dimethoxytin, diisopropoxytin, dibutoxytin, dibutyryloxytin, diethyltin, tetrabutyltin, tin bis(2,4-pentanedionato), ethyltin acetoacetonato, ethoxytin (2,4-pentanedionato), dimethyltin (2,4-pentanedionato), diacetomethylacetatotin, diacetoxytin, dibutoxydiacetoxytin, diacetoxytin diacetoacetonato, tin hydride, tin dichloride, tin tetrachloride, triethoxytitanium, trimethoxytitanium, triisopropoxytitanium, tributoxytitanium, tetraethoxytitanium, tetraisopropoxytitanium, methyldimethoxytitanium, ethyltriethoxytitanium, methyltripropoxytitanium, triethyltitanium, triisopropyltitanium, tributyltitanium, tetraethyltitanium, tetraisopropyltitanium, tetrabutyltitanium, tetradimethylaminotitanium, dimethyltitanium di(2,4-pentanedionato), ethyltitanium tri(2,4-pentanedionato), titanium tris(2,4-pentanedionato), titanium tris(acetomethylacetato), triacetoxytitanium, dipropoxypropionyloxytitanium, dibutyryloxytitanium, monotitanium hydride, dititanium hydride, trichlorotitanium, tetrachlorotitanium, tetraethylsilane, tetramethylsilane, tetraisopropylsilane, tetrabutylsilane, tetraisopropoxysilane, diethylsilane di(2,4-pentanedionato), methyltriethoxysilane, ethyltriethoxysilane, silane tetrahydride, disilane hexahydride, tetrachlorosilane, methyltrichlorosilane, diethyldichlorosilane, isopropoxyaluminum, tris(2,4-pentanedionato)nickel, bis(2,4-pentanedionato)manganese, isopropoxyboron, tri-n-butoxyantimony, tri-n-butylantimony, di-n-butylbis(2,4-pentanedionato)tin, di-n-butyldiacetoxytin, di-t-butyldiacetoxytin, tetraisopropoxytin, zinc di(2,4-pentanedionate), and combinations thereof. Furthermore precursors can be used as for example described in EP-A-1351321 or EP-A-1371752.

In the present invention embodiments the plasma gas including the precursor to be deposited via atmospheric pressure glow discharge plasma is brought into contact with two resin substrates 6a, 6b (e.g. in the form of continuous rolls) synchronously. At least three treatment spaces 5 are being used as can be seen in the embodiment of FIG. 2a. These steps will result in less consumption of precursor and/or carrier materials and as such to much more efficient application of plasma gas including precursor to be used onto the substrates 6a, 6b, which provides benefits from economical and commercialization point of view. The embodiments described with reference to FIGS. 1, 2a and 2b above are only illustrative for plasma gas contacting two rolls of resins (i.e. substrates 6a, 6b) synchronously, it may be understood that the method may include also the use of a remote plasma device and jetting the plasma gas including the precursor element to be deposited onto the two resin rolls 6a, 6b synchronously. Further the use of atmospheric pressure glow discharge avoids the use of complex and expensive vacuum equipment which makes the process simpler and more cost-effective.

As a result of the deposition on each substrate 6a, 6b an inorganic barrier 14 is formed with a thickness of e.g. 450 nm or above. Such depositions on flexible substrates 6a, 6b have not been described in literature without having cracks. This invention allows the deposited substrate 6a', 6b' to be used as half-product or intermediate product for photo-voltaic (PV) back-sheet or front-sheet applications.

It may be well understood that as a result of the use of at least three separate treatment spaces 5 precursor and gas mixture composition in each treatment space 5 may be varied and as such may result in varied depositions on the substrates 6a, 6b.

Each inorganic barrier layer 14 will display typically a water vapour transmission rate (WVTR) of about 0.005 $g/m^2 \cdot day$ before the lamination step of a further embodiment of this invention.

In FIGS. 2a and b the lamination process is shown according an embodiment of this invention. The pair of inorganic barrier layers 6a', 6b' are suitably bonded or laminated together with an adhesive 15 on the inorganic barrier 14 side facing each other, using the laminating apparatus 23. In the embodiment shown in FIG. 3 a multi-layer stack structure 12 is obtained by first forming two substrates 6a', 6b' with an inorganic barrier layer 14 in the at least three treatment spaces 5, similar to the embodiment of FIG. 1. The treated substrates 6a', 6b' are then fed to two laminating rollers 21, 22 (see FIG. 1), and an adhesive material is applied the to inorganic layer side of substrates 6a', 6b' using an adhesive applicator 20 (see FIG. 1). The laminating rollers 21, 22 are arranged to provide heat or radiation to the adhesive material between the treated substrates 6a', 6b', in order to cure or modify the adhesive material to form an adhesive layer 15.

As a result a multi layer stack structure 12 is obtained having an excellent barrier for water vapour. In one particular embodiment of this invention already excellent barrier properties were observed in the case when one [resin layer-inorganic]-layer stack combination 6a is adhered to another one [inorganic-organic]-layer stack combination 6b using an adhesive 15 between the two opposing face related inorganic barrier coatings 14 resulting in a multi layer stack structure 12 comprising the following layers as shown in cross section in FIG. 3a: i) organic resin (substrate 6a); ii) an inorganic barrier 14; iii) an adhesive 15; iv) an inorganic barrier 14 and v) an organic resin (substrate 6b). Also indicated are the semi-products 6a', 6b' each comprising a substrate 6a, 6b and a barrier layer 14.

In this particular embodiment the laminate structure may display a typical water vapour transmission rate (WVTR) of lower than 0.001 $g/m^2 \cdot day$.

It may be well understood that as a result of the 2-rolls-to-1-roll operation as described above in relation to FIG. 3a, a further product multi-layer stack structure 12 can be prepared by using each produced multi-layer stack structure 12 as a starting substrate roll(s) in another separate 2 roll-to-1 roll operation step. The separate structures 12 are laminated using an additional adhesive layer 16 as shown in the cross sectional view of FIG. 3b. As a result a thicker multi-stack layer structure 12 may be prepared comprising i) [organic resin-inorganic barrier-adhesive-inorganic barrier-organic resin layer-adhesive]$_n$ layers and ii) [organic resin-inorganic barrier-adhesive-inorganic barrier-organic resin layer], layer where n is an integer larger than 0. As a result even better barrier properties may be observed for these types of multi-stack layer structures 12.

Adhesives 15, 16 that may be applied for bonding the inorganic barrier layers 14 include all suitable thermoplastic- and elasto-plastic polymers; polymers which are curable by radiation such as by ultraviolet or electron-beam, by heat, by chemical initiators or by combinations thereof; organic or organic-containing adhesives, such as acrylics, urethanes, epoxides, polyolefins, organosilicones and others; and products of plasma-polymerization, oligomerization, or curing of organic-, organosilicon and other organometallic compounds, either volatile or deposited by other means such as spraying, sputtering, casting or dip-coating.

Figure 3A:
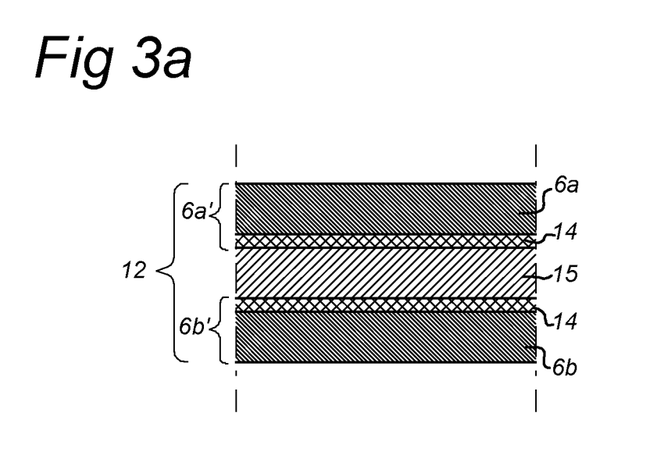
FIGS. 3a and b show cross sectional views of a structure according to various embodiments of the present invention.
Figure 3B:
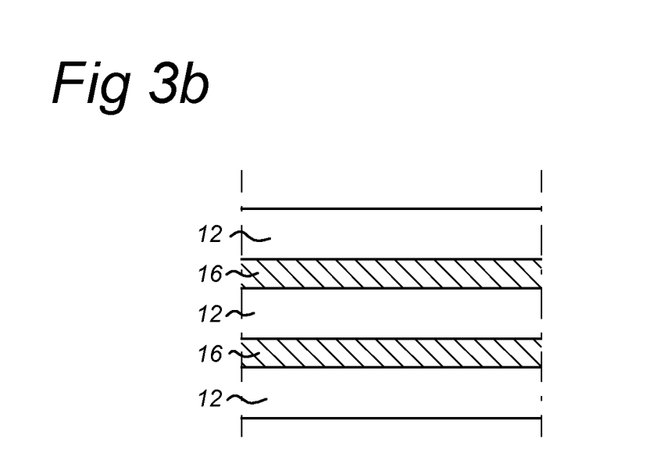

The adhesive forms an adhesive layer 15 bonding the two opposing faces of inorganic barrier layers 14 in the embodiment of FIG. 3a and an additional adhesive layer 16 bonding two substrates 6a, 6b of different multi-layer stack structures 12 in the embodiment of FIG. 3b. The adhesive layer 15, 16 may suitably have a thickness of 50 nm to 1000 μm, preferably from 100 nm to 100 μm.

Further in order to prevent ultraviolet deterioration ultraviolet absorbers or photo-stabilizers (such as hindered amine compounds) may be added to the adhesive.

The multi-layer stack structures 12 may be applied in several devices as under- or over-layer protection means. Possible use of these multi-layers is in protecting PV-cells or PV-battery modules by using these multi-layers enveloping the PV-battery cells or modules. A further possible embodiment is the use of the multi-layer stacks as protective sheet such as a back-sheets in PV-cells or PV-battery modules.

The multi-layer material (single or multiple multi-layer stack structures 12) according to the invention may be used also in other types of devices, such as liquid crystal displays, which are known in prior art to require transparent materials impermeable to oxygen and water vapour.

EXAMPLES

Example 1-11

All electrode couples 2, 3 have been independently dynamically matched to an own power-supply. The power was continuously supplied to each unit (AC/800 W/200 kHz). As precursor in each treatment space 5, 2 ppm TEOS was used.

The gas mixture in each treatment space contained a $O_2/N_2$-mixture and is respectively controlled on 10%/90% except for examples 8, 9, 10 and 11.

Example 8 used in each treatment space a $O_2/N_2$-mixture and is respectively controlled on 6%/94%.

Example 9 used in each treatment space a $O_2/N_2$-mixture and is respectively controlled on 1%/99%.

Example 10 and 11 used in each treatment space common air as gas-mixture. Further in each example conditions in the treatment spaces 5 were kept the same. As substrate 6a,6b PET ST505 (Melinex) from DuPont Tejin Films (width 20 cm/thickness 100 μm) was used.

Comparative Example 1

Two barrier films 14 are deposited synchronously using the electrode set-up as shown in FIG. 1 using an atmospheric pressure plasma device 10 and one treatment space 5. On both sides of the substrates 6a, 6b facing the plasma discharge a SiOx layer 14 of 450 nm is deposited. Samples are collected from both substrates which show visually cracks as defects. Further both sheets have a WVTR of typically of about 1 $g/m^2 \cdot day$.

The substrates are brought together with the facing side to each other and laminated with a hydrophobic acrylate of 10 micron which was followed by UV-curing. The resulted multi-layer stack shows visually crack defects and has a WVTR of about 1 $g/m^2 \cdot day$.

Comparative Example 2

Two barrier films 14 are deposited simultaneously using the set-up as shown in FIG. 1 using an atmospheric pressure plasma device 10 and two subsequent treatment spaces resulting in two substrates having both a SiOx-barrier layer of 450 nm. Treatment space conditions were same as done in comparative example 1 however line speed of the substrates was 100% higher as in example 1.

The substrates are brought together with the facing side to each other and laminated with a hydrophobic acrylate of 10 micron which was followed by UV-curing. The resulted multi-layer stack shows visually tiny crack-defects and has a WVTR of about 0.6 $g/m^2 \cdot day$.

Example 3

Two barrier films 14 are deposited simultaneously using the set-up as shown in FIG. 2a using an atmospheric pressure plasma device 10 and three subsequent treatment spaces resulting in two substrates having both a SiOx-barrier layer of 450 nm.

Treatment space conditions were same as in example 1 conditions however the line speed of the substrates was 200% higher as in example 1.

The substrates are brought together with the facing side to each other and laminated with a hydrophobic acrylate of 10 micron which was followed by UV-curing.

The resulted multi-layer stack shows no crack-defects and has a WVTR of $1.3*10^{-3}$ $g/m^2 \cdot day$.

Example 4

Two barrier films 14 are deposited simultaneously using the set-up as shown in FIG. 2a except the substrates were fed using four subsequent treatment spaces using an atmospheric pressure plasma device 10 resulting in two substrates having both a SiOx-barrier layer of 450 nm.

Treatment space conditions were same as in example 1 conditions however the line speed of the substrates was 300% higher as in example 1.

The substrates are brought together with the facing side to each other and laminated with a hydrophobic acrylate of 10 micron which was followed by UV-curing.

The resulted multi-layer stack shows no crack-defects and has a WVTR of about $9.6*10^{-4}$ $g/m^2 \cdot day$.

Example 5

Two barrier films 14 are deposited simultaneously using the set-up as shown in FIG. 2a except the substrates were fed using five subsequent treatment spaces using an atmospheric pressure plasma device 10 resulting in two substrates having both a SiOx-barrier layer of 450 nm.

Treatment space conditions were same as in example 1 conditions however the line speed of the substrates was 400% higher as in example 1.

The substrates are brought together with the facing side to each other and laminated with a hydrophobic acrylate of 10 micron which was followed by UV-curing. The resulted multi-layer stack shows no crack-defects and has a WVTR of about $7.4*10^{-4}$ g/m$^2$·day.

Example 6

Two barrier films 14 are deposited simultaneously using the set-up as shown in FIG. 2a except the substrates were fed using six subsequent treatment spaces using an atmospheric pressure plasma device 10 resulting in two substrates having both a SiOx-barrier layer of 450 nm.

Treatment space conditions were same as in example 1 conditions however the line speed of the substrates was 500% higher as in example 1.

The substrates are brought together with the facing side to each other and laminated with a hydrophobic acrylate of 10 micron which was followed by UV-curing.

The resulted multi-layer stack shows no crack-defects and has a WVTR was found to be below the detection limit of the Mocon Aquatran which is below $5*10^{-4}$ g/m$^2$·day.

Example 7

Two barrier films 14 are deposited simultaneously using the set-up as shown in FIG. 2a except the substrates were fed using four subsequent treatment spaces using an atmospheric pressure plasma device 10 resulting in two substrates having both a SiOx-barrier layer of 600 nm.

Treatment space conditions were same as in example 1 conditions however the line speed of the substrates was 300% higher as in example 1.

The substrates are brought together with the inorganic barrier facing side to each other and laminated with a hydrophobic acrylate of 10 micron which was followed by UV-curing.

The resulted multi-layer stack shows no crack-defects and has a WVTR of $9.6*10^{-4}$ g/m$^2$·day.

Example 8

Two barrier films 14 are deposited simultaneously using the set-up as shown in FIG. 2a except the substrates were fed using four subsequent treatment spaces using an atmospheric pressure plasma device 10 resulting in two substrates having both a SiOx-barrier layer of 600 nm.

Treatment space conditions were same as in example 7 conditions except for the oxygen concentration in all treatment spaces which was controlled to be on 6%.

The substrates are brought together with the inorganic barrier facing side to each other and laminated with a hydrophobic acrylate of 10 micron which was followed by UV-curing.

The resulted multi-layer stack shows no crack-defects and has a WVTR of $1.3*10^{-3}$ g/m$^2$·day.

Comparative Example 9

Two barrier films 14 are deposited simultaneously using the set-up as shown in FIG. 2a except the substrates were fed using four subsequent treatment spaces using an atmospheric pressure plasma device 10 resulting in two substrates having both a SiOx-barrier layer of 600 nm.

Treatment space conditions were same as in example 7 conditions except for the oxygen concentration in all treatment spaces which was controlled to be on 2%.

The substrates are brought together with the inorganic barrier facing side to each other and laminated with a hydrophobic acrylate of 10 micron which was followed by UV-curing.

The resulted multi-layer stack shows some visual crack-defects and has a WVTR of 0.6 g/m$^2$·day.

Example 10

Two barrier films 14 are deposited simultaneously using the set-up as shown in FIG. 2a except the substrates were fed using six subsequent treatment spaces using an atmospheric pressure plasma device 10 resulting in two substrates having both a SiOx-barrier layer of 450 nm.

Treatment space conditions were same as in example 1 conditions however the line speed of the substrates was 500% higher as in example 1 and as gas mixture air was used.

The substrates are brought together with the facing side to each other and laminated with a hydrophobic acrylate of 10 micron which was followed by UV-curing. The resulted multi-layer stack shows no crack-defects and has a WVTR was found to be below the detection limit of the Mocon Aquatran which is below $5*10^{-4}$ g/m$^2$·day.

Example 11

Two barrier films 14 are deposited simultaneously using the set-up as shown in FIG. 2a except the substrates were fed using nine subsequent treatment spaces using an atmospheric pressure plasma device 10 resulting in two substrates having both a SiOx-barrier layer of 450 nm.

Treatment space conditions were same as in example 1 conditions however the line speed of the substrates was 800% higher as in example 1 and as gas mixture air was used in the treatment spaces.

The substrates are brought together with the facing side to each other and laminated with a hydrophobic acrylate of 10 micron which was followed by UV-curing. The resulted multi-layer stack shows no crack-defects and has a WVTR was found to be below the detection limit of the Mocon Aquatran which is below $5*10^{-4}$ g/m$^2$·day.

The invention claimed is:

1. A method for manufacturing a water vapour barrier layer on a flexible substrate, comprising depositing an inorganic layer on the substrate in a treatment space having a gas atmosphere, the treatment space being formed between at least two electrodes for generating an atmospheric pressure glow discharge plasma, characterized in that (i) the barrier layer is formed by at least three subsequent inorganic layer depositions on the substrate, each inorganic layer deposition being at most 150 nm in thickness, (ii) the treatment space comprises between 4 and 25% of oxygen, and (iii) the barrier layer is formed with a duty cycle of 100%.

2. The method of claim 1, wherein each inorganic layer deposited is thicker than 50 nm.

3. The method of claim 1, wherein the at least three inorganic layer depositions are each being executed in separate treatment spaces.

4. The method of claim 1, wherein two of the at least three inorganic layer depositions are being executed in the same treatment space.

5. The method of claim 1, wherein two, three, or all of the at least three inorganic layers are formed of the same material.

6. The method of claim 1, further comprising manufacturing a multi-layer stack structure, the structure comprising in order a substrate, a barrier layer, an adhesive layer, a barrier layer, and a substrate, by laminating two substrates with a barrier layer with an adhesive layer in between the facing surfaces of the barrier layers to obtain the multi-layer stack structure.

7. The method according to claim 6, further comprising laminating two or more multi-layer stack structures with an additional adhesive layer in between.

8. The method according to claim 6, in which the two substrates are provided on a roll to obtain the multi-layer stack structure in a continuous process.

9. The method according to claim 6, in which the two substrates are treated simultaneously.

10. The method according to claim 6, in which the two substrates are treated in the same treatment spaces.

11. The method of claim 6, wherein each inorganic layer deposited is thicker than 50 nm, the at least three inorganic layer depositions are each being executed in separate treatment spaces, two, three, or all of the at least three inorganic layers are formed of the same material and a gas atmosphere is provided in each treatment space, wherein the gas atmosphere comprises between 4 and 25% of oxygen.

12. The method of claim 6, wherein each inorganic layer deposited is thicker than 50 nm, two of the at least three inorganic layer depositions are being executed in the same treatment space, two, three, or all of the at least three inorganic layers are formed of the same material and a gas atmosphere is provided in each treatment space, wherein the gas atmosphere comprises between 4 and 25% of oxygen.

13. The method of claim 1, further comprising manufacturing a multi-layer stack structure, the structure comprising in order a substrate, a barrier layer, an adhesive layer, a barrier layer, and a substrate, by laminating two substrates with a barrier layer with an adhesive layer in between the facing surfaces of the barrier layers to obtain the multi-layer stack structure.

14. The method of claim 13, wherein each inorganic layer deposited is thicker than 50 nm, two of the at least three inorganic layer depositions are being executed in the same treatment space, two, three, or all of the at least three inorganic layers are formed of the same material and a gas atmosphere is provided in each treatment space, wherein the gas atmosphere comprises between 4 and 25% of oxygen.

15. The method of claim 1, wherein each inorganic layer deposited is thicker than 50 nm, the at least three inorganic layer depositions are each being executed in separate treatment spaces, two, three, or all of the at least three inorganic layers are formed of the same material and a gas atmosphere is provided in each treatment space, wherein the gas atmosphere comprises between 4 and 25% of oxygen.

16. The method of claim 1, wherein each inorganic layer deposited is thicker than 50 nm, two of the at least three inorganic layer depositions are being executed in the same treatment space, two, three, or all of the at least three inorganic layers are formed of the same material and a gas atmosphere is provided in each treatment space, wherein the gas atmosphere comprises between 4 and 25% of oxygen.

17. The method of claim 1, wherein each inorganic layer deposited is thicker than 60 nm.

18. The method of claim 1, wherein each inorganic layer deposited is thicker than 100 nm.

19. The method of claim 1, wherein the gas atmosphere comprises between 6 and 21% of oxygen.

* * * * *